United States Patent [19]

Kupfer

[11] Patent Number: 4,756,024

[45] Date of Patent: Jul. 5, 1988

[54] RF-INPUT CIRCUIT ARRANGEMENT FOR A TELEVISION TUNER

[75] Inventor: Karl-Heinz Kupfer, Krefeld, Fed. Rep. of Germany

[73] Assignee: U.S. Philips Corporation, New York, N.Y.

[21] Appl. No.: 838,505

[22] Filed: Mar. 11, 1986

[30] Foreign Application Priority Data

Mar. 16, 1985 [DE] Fed. Rep. of Germany ....... 3509516

[51] Int. Cl.$^4$ ............................ H04B 1/16; H03J 5/24
[52] U.S. Cl. ..................................... 455/188; 334/47; 334/56; 455/339
[58] Field of Search ............... 455/188, 189, 191, 176, 455/338, 339; 334/47, 56

[56] References Cited

U.S. PATENT DOCUMENTS

| | | | |
|---|---|---|---|
| 4,379,269 | 4/1983 | Ijichi | 455/188 |
| 4,555,808 | 11/1985 | Fujimoto | 455/189 |
| 4,577,171 | 3/1986 | Heigle et al. | 455/188 |
| 4,607,391 | 8/1986 | Matsuda | 455/188 |

Primary Examiner—Robert L. Griffin
Assistant Examiner—Curtis Kuntz
Attorney, Agent, or Firm—Gregory P. Gadson; Edward W. Goodman

[57] ABSTRACT

A circuit arrangement of input stages for a television tuner for the UHF, VHF and hyperband frequency bands in a continuous frequency range having primary bandpass filters for the UHF and VHF bands arranged in parallel, and connected to a signal input aerial (7). The input of the VHF primary bandpass filter is coupled to at least one grounded first inductance (27), series-arranged second and third inductances (29 and 31) between the output and the first inductance (27) and a grounded variable capacitor (33) arranged at the output and a first switch (35) which shunts the second inductance (29) and switches between the BI and the BIII ranges of the VHF band. A hyperband primary bandpass filter is integrated in the VHF primary bandpass filter, having a fourth inductance (53) coupled via a second switch (55) to the output (34) and to the input connection of the first inductance (27), and fifth inductance (51) which is connected to ground from the junction between the fourth inductance (53) and the second switch (55). For hyperband operation the second switch (55) is closed and the first switch (35) is open.

7 Claims, 2 Drawing Sheets

RF-INPUT CIRCUIT ARRANGEMENT FOR A TELEVISION TUNER

BACKGROUND OF THE INVENTION

The invention relates to an RF-input circuit arrangement for a television tuner for the UHF, VHF and hyperband frequency bands in a continuous frequency range of an aerial signal, comprising primary bandpass filters for the UHF and VHF bands arranged in parallel behind the aerial input, the VHF primary bandpass filter comprising at its input at least one inductance connected to ground, series-arranged, second and third inductances between the output and the first inductance, a variable capacitor arranged at the output and connected to ground and a first switch, which shunts the second inductance and serves for switching over between the BI and BIII ranges of the VHF band.

Such known input stages for television tuners, as used for example in the Philips tuner of the UV618 type, comprise separate primary bandpass filters for the UHF and VHF bands. The primary bandpass filter for the VHF band is switchable between the bands I and III by shunting an inductance in the filter. The VHF primary bandpass filter is preceded by a low-pass filter whose cut-off frequency is at approximately 380 MHz. Further filters may be interposed between this low-pass filter and the VHF primary bandpass filter such as, for example, an IF high-pass filter. The primary bandpass filter of the UHF band is preceded by a high-pass filter whose cut-off frequency is at approximately 400 MHz. The aerial signal is split up into two frequency ranges by the low-pass filter preceding the VHF primary bandpass filter and by the high-pass filter preceding the UHF primary bandpass filter, so that the losses are maintained very small because the UHF frequency range is only applied to the UHF primary bandpass filter and is cut off before the VHF bandpass filter. Thus there is no UHF energy loss in the VHF primary bandpass filter. This similarly applies to the VHF frequency range which is cut off before the UHF primary bandpass filter by the high-pass filter preceding the UHF bandfpass filter so that no energy losses occur in the VHF frequency range.

SUMMARY OF THE INVENTION

It is an object of the invention to additionally provide an input stage for the hyperband in addition to the input stages for the UHF and VHF frequency bands in a circuit arrangement of a television tuner.

According to the invention the envisaged object is solved in that a hyperband primary bandpass filter is integrated in the VHF primary bandpass filter, comprising a fourth inductance which is coupled via a second switch to the output and in the input connection of the first inductance, and a fifth inductance which is coupled between the junction between the fourth inductance and the second switch on the one side and ground on the other side, the second switch being closed and the first switch being open for hyperband operation.

While requiring few additional elements, this circuit arrangement provides an integration of the hyperband part in a simple construction of the circuit arrangement. As in addition the primary bandpass filters for the hyperband and the VHF band have a common output, a simple coupling of a common subsequent amplifier stage is possible. In a parallel arrangement of three parallel bandpass filters for VHF, UHF and hyperband it would hardly be possible to apply the aerial energy before the bandpass filters to the appropriate primary bandpass filter so that losses occur in the other filters. Since the hyperband is arranged with respect to frequency between the VHF band and the UHF band, VHF and UHF energy losses would occur particularly in the primary bandpass filter of the hyperband, which could only be obviated by arranging a switching diode before the hyperband primary bandpass filter. The circuit arrangement according to the invention obviates these problems in that the hyperband primary bandpass filter is integrated in the VHF primary bandpass filter so that a third parallel-arranged filter is not required. Similarly, low UHF energy losses occur in the VHF hyperband primary bandpass filter, likewise as in the prior art VHF primary bandpass filter.

According to a further embodiment of the invention a sixth inductance is arranged between the first and second inductances and the junction between the second and sixth inductances constitutes the input of the primary bandpass filter for the VHF band and hyperband.

According to a further embodiment of the invention a d.c. shunt is arranged subsequent to the aerial input.

This shunt of possibly occurring direct currents may be, for example, in the form of a grounded inductance.

According to further embodiments of the invention an IF high-pass filter, an IF trap filter, a VHF trap filter or a CB trap filter precede the VHF and hyperband primary bandpass filters.

Since no high-pass filter precedes the VHF and hyperband primary bandpass filters, it may be desirable to arrange further trap filters before the primary bandpass filter. Of course a plurality of these filters may also be arranged in succession before the primary bandpass filter.

BRIEF DESCRIPTION OF THE DRAWINGS

Two embodiments of the invention will be described in greater detail with reference to the drawings.

DETAILED DESCRIPTION OF THE INVENTION

Figure 1:
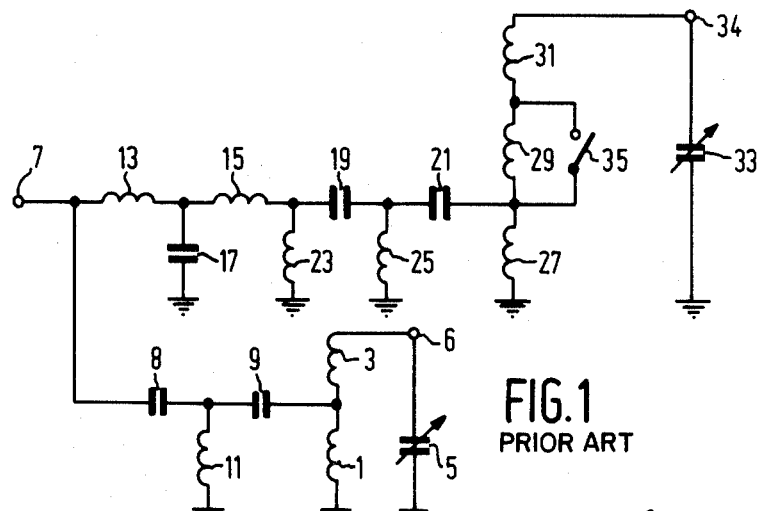
FIG. 1 shows a circuit arrangement of the input stages for the UHF and VHF frequency bands according to the prior art.

To elucidate the circuit problem to be solved, FIG. 1 shows a prior art circuit arrangement having two parallel-arranged primary bandpass filters for the UHF and VHF range. The UHF bandpass filter consists of the series-arrangment of two inductances 1 and 3 and a variable capacitor 5 whose first connection is grounded and whose second connection represents the output 6 of the UHF bandpass filter. Arranged between the aerial input 7 and the UHF primary bandpass filter is a high-pass filter which is connected to the junction of the inductances 1 and 3 of the UHF primary bandpass filter via two series-arranged capacitors 8 and 9 from whose junction an inductance 11 is connectd to ground. A low-pass filter is likewise connected between the aerial input and the input of the VHF primary bandpass filter, which loss-pass filter consists of two series-arranged inductances 13, 15 from whose junction a capacitor 17 is connected to ground and a high-pass filter arranged subsequent thereto comprising two series-arranged capacitors 19 and 21, one grounded inductance 23 preceding the capacitor 19 and one grounded inductance 25 preceding the capacitor 21. From this input a so-called first inductance 27 is connected to ground and two further series-arranged so-called second and third inductance 29 and 31 are connected to a variable capacitor 33 which is connected to ground and constitutes the output 34 of the VHF primary bandpass filter. The second inductance 29 may be shunted or shortcircuited by means of a first switch 35 which may have the form of, for example, a switching diode. This first switch 35 is used for switching between the ranges I and III of the VHF band.

Figure 2:
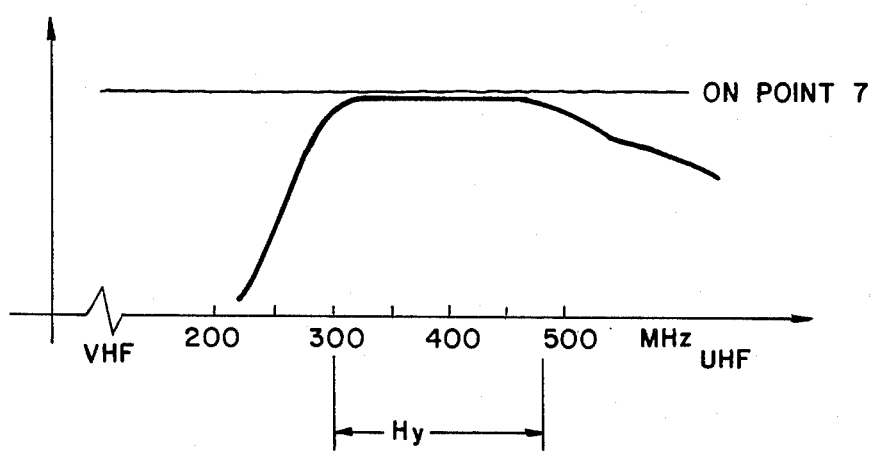
FIG. 2 shows an RF signal before and after passing through a hyperband band pass filter along with a D.C. shunt.

FIG. 2 has a graph showing a typical RF input signal, and a graph showing this signal after passing through a hyperband band pass filter along with a D.C. shunt.

Figure 3:
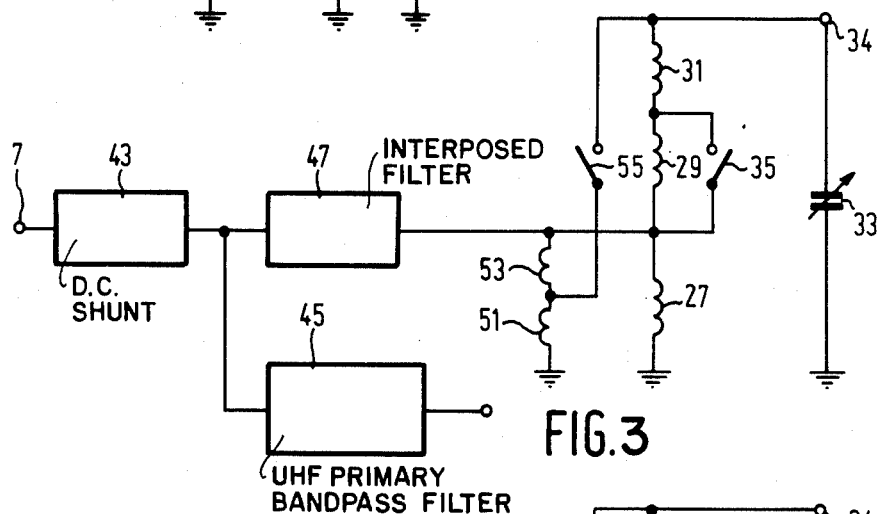
FIG. 3 shows a first embodiment of the circuit arrangement of the input stages for the UHF, VHF and hyperband frequency ranges according to the invention.

Starting from this prior art, FIG. 3 shows the first embodiment of the circuit arrangement according to the invention. A d.c. shunt 43 is arranged subsequent to the aerial input 7. This d.c. shunt is succeeded by the UHF primary bandpass filter 45, which is constructed in known manner, on the one hand and by the VHF and hyperband primary bandpass filter via a possible interposed filter 47 on the other hand. The VHF primary bandpass filter comprising the first, second and third inductances 27, 29, 31, the variable capacitor 33 and the first switch 35 is constructed likewise as the above-described known VHF primary bandpass filter. The hyperband primary bandpass filter integrated in the VHF primary bandpass filter comprises two series-arranged, grounded so-called fourth and fifth inductances 53 and 51 connected from the junction of the first and second inductances 27 and 29, and of a second switch 55 connected between the junction of the fourth and fifth inductances 53 and 51 and the junction between the third inductance 31 and the variable capacitor 33. In the case of VHF operation the second switch 55 is open; the fourth and fifth inductances 53 and 51 arranged in parallel with the first inductance 27 have a relatively high value with respect to the first inductance 27, but this may be taken into account when dimensioning the inductances. In the case of hyperband operation the first switch 35 must be open and the second switch 55 must be closed. The hyperband primary bandpass filter is then formed by the series arrangement of the fifth inductance 51 and the capacitor 33, the signal being applied via the fourth inductance 53 to the junction between the fifth inductance 51 and the capacitor 33. In this case the series-arranged first, second and third inductances 27, 29 and 31 are in parallel with the fifth inductance 51. Since the series arrangement of these inductances constitutes a much higher inductance than the fifth inductance 51, they are hardly important.

In this circuit arrangement only the switches 35 and 55 which may be in the form of, for example, switching diodes must be switched accordingly when switching over between the ranges I and III of the VHF band and the hyperband.

Figure 4:
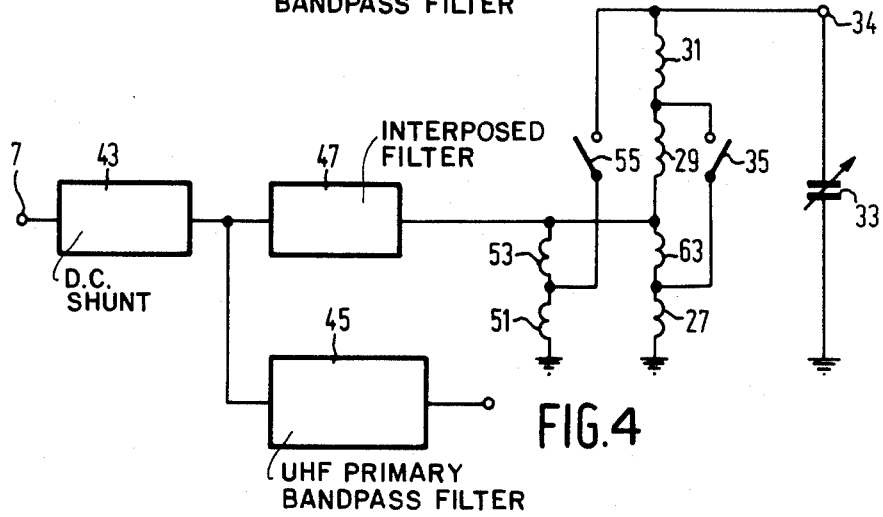
FIG. 4 shows a second embodiment of the circuit arrangement of the input stages for the UHF and VHF frequency bands and hyperband according to the invention.

FIG. 4 shows the second embodiment of the circuit arrangement according to the invention. A sixth inductance 63 is arranged between the first and second inductances 27 and 29. The second and sixth inductances 29 and 63 whose junction represents the input of the primary bandpass filter, may be shunted or shortcircuited by means of the first switch 35. This second embodiment provides further adaptation possibilities, but basically it is identical to the first embodiment of the invention.

The two embodiments of the circuit arrangement provide an extremely simple and component-saving integration of the hyperband range in the VHF primary bandpass filter. Existing circuit concepts for television tuners intended for reception in the VHF and UHF ranges need only to be slightly modified.

I claim:

1. An RF-input circuit arrangement for a television tuner for the UHF, VHF and hyperband frequency bands in a continuous frequency range of an aerial signal, comprising primary bandpass filters for the UHF and VHF bands arranged in parallel and coupled to an aerial input, the VHF primary bandpass filter comprising at its input at least one grounded inductance (27), series-arranged second and third inductances (29 and 31) coupled between an output of said VHF primary bandpass filter (34) and the first inductance (27), a grounded, variable capacitor (33) coupled to the output (34) and a first switch (35) shunting the second inductance (29) and used for switching-over between a first and a second range of the VHF band, characterized in that a hyperband primary bandpass filter is integrated in the VHF primary bandpass filter, said hyperband primary bandpass filter comprising a fourth inductance (53) coupled via a second switch (55) to the output (34) and to an input connection of the first inductance (27), and a fifth inductance (51) which is coupled between the junction between the fourth inductance (53) and the second switch (55) on the one side and ground on the other side, the second switch (55) being closed and the first switch (35) being open for hyperband operation.

2. A circuit arrangement as claimed in claim 1, characterized in that a sixth inductance (63) is coupled between the first and second inductance (27 and 29) and in that the junction between the second and sixth inductances (29 and 63) is the input of the primary bandpass filter for the VHF band and hyperband.

3. A circuit arrangement as claimed in claim 1, characterized in that a d.c. shunt (43) is coupled between said aerial input and said primary bandpass filters.

4. A circuit arrangement as claimed in claim 1, characterized in that an IF high-pass filtr is coupled to an input of the VHF and hyperband primary bandpass filter.

5. A circuit arrangement as claimed in claim 1, characterized in that an IF trap filter is coupled to an input of the VHF and hyperband primary bandpass filters.

6. A circuit arrangement as claimed in claim 1, characterized in that a VHF trap filter is coupled to an input of the VHF and hyperband primary bandpass filters.

7. A circuit arrangement as claimed in claim 1, characterized in that a CB trap filter is coupled to an input of the VHF and hyperband primary bandpass filters.

* * * * *